United States Patent
Lee et al.

(10) Patent No.: US 10,147,597 B1
(45) Date of Patent: Dec. 4, 2018

(54) TURBULENT FLOW SPIRAL MULTI-ZONE PRECURSOR VAPORIZER

(71) Applicant: LAM RESEARCH CORPORATION, Fremont, CA (US)

(72) Inventors: James Forest Lee, Damascus, OR (US); Mitchell Lamar, Vancouver, WA (US); Matthew Scott Mudrow, Tigard, OR (US); Mathew Joseph Weissinger, Portland, OR (US); Damodar Shanbhag, Tualatin, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/704,151

(22) Filed: Sep. 14, 2017

(51) Int. Cl.
*H01L 21/02* (2006.01)
*B05B 7/16* (2006.01)
*C23C 16/448* (2006.01)
*C23C 16/455* (2006.01)

(52) U.S. Cl.
CPC ...... *H01L 21/02104* (2013.01); *B05B 7/1606* (2013.01); *B05B 7/168* (2013.01); *C23C 16/4483* (2013.01); *C23C 16/45527* (2013.01)

(58) Field of Classification Search
CPC ......... H01L 21/02104; C23C 16/45527; C23C 16/4483; B05B 7/1606; B05B 7/168
See application file for complete search history.

(56) References Cited

U.S. PATENT DOCUMENTS

| | | | |
|---|---|---|---|
| 4,255,646 A | 3/1981 | Dragoy et al. | |
| 5,835,677 A | 11/1998 | Li et al. | |
| 6,210,485 B1 | 4/2001 | Zhao et al. | |
| 6,245,151 B1 | 6/2001 | Bhandari et al. | |
| 6,303,501 B1 | 10/2001 | Chen et al. | |
| 6,332,601 B1 | 12/2001 | Huston et al. | |
| 8,554,064 B1 | 10/2013 | Dinh et al. | |
| 2002/0148406 A1 | 10/2002 | Porter et al. | |
| 2002/0192375 A1 | 12/2002 | Sun et al. | |
| 2005/0147749 A1 | 7/2005 | Liu et al. | |
| 2007/0001326 A1 | 1/2007 | Toda et al. | |
| 2007/0054049 A1 | 3/2007 | Lindfors et al. | |
| 2008/0102203 A1 | 5/2008 | Wu et al. | |
| 2010/0065972 A1 | 3/2010 | Liu | |

(Continued)

FOREIGN PATENT DOCUMENTS

| | | |
|---|---|---|
| CN | 104457392 A | 3/2015 |
| WO | 99/04061 A1 | 1/1999 |
| WO | 02/068713 A1 | 9/2002 |

*Primary Examiner* — Kyoung Lee
(74) *Attorney, Agent, or Firm* — Buchanan Ingersoll & Rooney PC

(57) ABSTRACT

A vaporizer useful for depositing material on a semiconductor substrate in a chamber of a chemical vapor deposition apparatus includes a first inlet configured to receive an atomized precursor, a second inlet configured to receive carrier gas, a flow path in fluid communication with the first and second inlets and configured to effect turbulent flow of an atomized precursor and carrier gas stream supplied to the first and second inlets. A plurality of heating elements includes a first heater element configured to heat a first zone of the flow path and a second heater element configured to heat a second zone of the flow path. An outlet in fluid communication with the flow path is configured to deliver vapor produced from the atomized precursor.

20 Claims, 6 Drawing Sheets

(56) References Cited

U.S. PATENT DOCUMENTS

| | | |
|---|---|---|
| 2011/0111136 A1 | 5/2011 | Slevin et al. |
| 2012/0156108 A1 | 6/2012 | Fondurulia et al. |
| 2013/0203264 A1 | 8/2013 | Liu et al. |
| 2013/0333768 A1 | 12/2013 | Chandrasekharan et al. |
| 2014/0048141 A1 | 2/2014 | Womack et al. |
| 2014/0096834 A1 | 4/2014 | Slevin et al. |
| 2015/0099372 A1 | 4/2015 | Chandrasekharan et al. |
| 2015/0187568 A1 | 7/2015 | Pettinger et al. |
| 2015/0240355 A1 | 8/2015 | Nasman |
| 2015/0377481 A1 | 12/2015 | Smith et al. |
| 2016/0097119 A1 | 4/2016 | Cui et al. |
| 2016/0222508 A1 | 8/2016 | Schoepp et al. |
| 2016/0240419 A1* | 8/2016 | Sieber .................. C23C 16/4585 |
| 2016/0312360 A1 | 10/2016 | Rasheed et al. |
| 2016/0334099 A1 | 11/2016 | Dinh et al. |
| 2017/0016115 A1 | 1/2017 | Chandrasekharan et al. |
| 2017/0032982 A1 | 2/2017 | Drewey et al. |
| 2017/0121818 A1 | 5/2017 | Dunn et al. |
| 2017/0175269 A1 | 6/2017 | Chandrasekharan et al. |

\* cited by examiner

TURBULENT FLOW SPIRAL MULTI-ZONE PRECURSOR VAPORIZER

BACKGROUND

Certain semiconductor manufacturing processes require precursors to be vaporized before introduction into semiconductor processing chambers. The precursors are often provided in liquid form, thus vaporizers are necessary to vaporize the liquid precursors. Conventional vaporizers often vaporize liquid precursors by spraying the precursor through an atomizer nozzle and then heating the atomized precursor in a heated carrier gas.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In an embodiment, a vaporizer, useful for supplying vapor to a chemical vapor deposition apparatus in which a semiconductor substrate is processed, comprises a first inlet configured to receive an atomized precursor, a second inlet configured to receive carrier gas, a single spiral flow path in fluid communication with the first and second inlets and configured to effect turbulent flow of an atomized precursor and carrier gas stream supplied to the first and second inlets, a plurality of heating elements including a first heater element configured to heat a first zone of the flow path and a second heater element configured to heat a second zone of the flow path, and an outlet in fluid communication with the flow path and configured to deliver vapor produced from the atomized precursor. The flow path preferably has a constant cross sectional flow area along the entire length thereof.

According to a first variation of the embodiment described above, the flow path can extend through a stacked plate arrangement, the stacked plate arrangement including a top plate having the first and second inlets therein, a first plate having the first heater element therein, a second plate having the second heater element therein, a first divider plate between the first and second plates and a bottom plate having the outlet therein.

In the first variation, a first portion of the flow path extending through the first plate includes a first upper spiral channel in an upper surface thereof, a first lower spiral channel in a lower surface thereof, and a first connecting passage providing fluid communication between the first upper spiral channel and the first lower spiral channel, the first plate attached to the top plate such that the first portion of the flow path is in fluid communication with the first and second inlets.

In the first variation, a second portion of the flow path extending through the second plate includes a second upper spiral channel in an upper surface thereof, a second lower spiral channel in a lower surface thereof, and a second connecting passage providing fluid communication between the second upper spiral channel and the second lower spiral channel, the first divider plate including a first passage therein connecting the first portion of the flow path in the first plate to the second portion of the flow path in the second plate.

In the first variation, the stacked plate arrangement can include a third plate having a third heater element therein and a second divider plate between the second and third plates, a third portion of the flow path in the third plate includes a third upper spiral channel in an upper surface thereof and a third lower spiral channel in a lower surface thereof, and a third connecting passage providing fluid communication between the third upper spiral channel and the third lower spiral channel, the second divider plate including a second passage therein connecting the second portion of the flow path in the second plate to the third portion of the flow path in the third plate.

In the first variation, O-ring seals are located between adjacent plates of the stacked plate arrangement, the first passage in the first divider plate is located in a center of the first divider plate and the second passage in the second divider plate is located in a center of the second divider plate.

In the first variation, the first heating element can comprise a first pair of resistance heaters located in horizontal bores extending into an outer periphery of the first plate, the second heating element can comprise a second pair of resistance heaters located in horizontal bores extending into an outer periphery of the second plate, the first and second plates optionally including temperature sensors configured to monitor temperatures of the first and second plates and provide feedback to a control unit configured to individually adjust temperatures of the first and second portions of the flow path.

In the first variation wherein the stacked plate arrangement includes a third plate, the first heating element can comprise a first pair of resistance heaters located in horizontal bores extending into an outer periphery of the first plate, the second heating element can comprise a second pair of resistance heaters located in horizontal bores extending into an outer periphery of the second plate, the third heating element can comprise a third pair of resistance heaters located in horizontal bores extending into an outer periphery of the third plate, the first, second and third plates including optional temperature sensors configured to monitor temperatures of the first, second and third plates and provide feedback to a control unit configured to individually adjust temperatures of the first, second and third portions of the flow path.

In a second variation of the embodiment described above, the flow path passes through a spiral tube embedded in a metal block, the metal block including a heating element configured to heat a first portion of the flow path and a second heating element configured to heat a second portion of the flow path, the metal block including temperature sensors configured to monitor temperatures of the first and second portions of the flow path and provide feedback to a control unit configured to individually adjust temperatures of the first and second portions of the flow path.

In the first variation wherein the stacked plate arrangement includes first and second plates, the first and second plates can be made of metal such as stainless steel or an aluminum alloy. The first and second upper spiral channels can be machined into the upper surfaces of the first and second plates, the first and second lower spiral channels can be machined into the lower surfaces of the first and second plates, the first connecting passage can extend between outermost portions of the first upper spiral channel and the first lower spiral channel, and the second connecting passage can extend between outermost portions of the second upper spiral channel and the second lower spiral channel.

In the first and second variations of the embodiment described above, the vaporizer can include an ultrasonic nozzle in fluid communication with the first inlet.

According to a second embodiment, a chemical vapor deposition apparatus includes a chamber in which a semiconductor substrate can be processed and the vaporizer described above wherein the vaporizer is configured to supply vaporized precursor into the chamber to deposit a layer of material on a semiconductor substrate supported therein.

In a first variation of the second embodiment, the chemical vapor deposition apparatus further comprises a control unit and temperature sensors configured to monitor temperatures of first and second portions of the flow path and provide feedback to the control unit, the control unit configured to individually adjust temperatures of the first and second portions of the flow path.

During operation of the chemical vapor deposition apparatus described above, the atomized precursor can be converted into vapor in the flow path and supplied to the chamber within 2 seconds.

According to a third embodiment, in a method of supplying vapor produced by the vaporizer described above to a chamber of a chemical vapor deposition apparatus, the method comprises supplying atomized liquid precursor to the first inlet, supplying carrier gas to the second inlet, flowing the atomized liquid precursor and carrier gas in the flow path while heating a first portion of the flow path to a first temperature and heating a second portion of the flow path to a second temperature, and flowing vapor from the outlet to an interior of the chamber.

According to the third embodiment, the atomized liquid precursor can be converted to a vapor in the flow path and supplied to the chamber within two seconds after traveling along the flow path, the flow path including a first spiral path extending in a first plane from a central portion of the vaporizer to an outer portion of the vaporizer, a second spiral path extending in a second plane from the outer portion of the vaporizer to the central portion of the vaporizer, a third spiral path extending in a third plane from the central portion of the vaporizer to the outer portion of the vaporizer, and a fourth spiral path extending in a fourth plane from the outer portion of the vaporizer to the central portion of the vaporizer.

The method can further comprise monitoring temperatures of the first and second portions of the flow path with temperature sensors, supplying data to a control unit representative of the monitored temperatures, and individually controlling temperatures of the first and second portions of the flow path based on the monitored temperatures.

In the method described above, the flow path preferably has a constant cross sectional flow area along the entire length thereof and the atomized liquid precursor and carrier gas undergo turbulent flow in the flow path.

In a preferred embodiment, the method can further comprise supporting a semiconductor substrate in the chamber, energizing the vapor into a plasma state, and depositing a layer of material on the semiconductor substrate.

DETAILED DESCRIPTION

Figure 1:
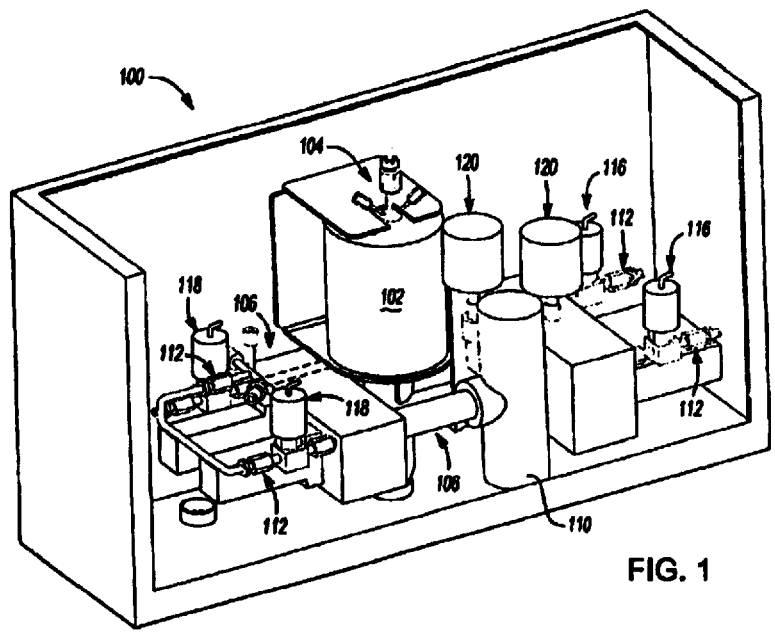
FIG. 1 shows a gas supplying section of a chemical vapor deposition apparatus which includes a vaporizer.

Details of one or more implementations of the subject matter described in this specification are set forth in the accompanying drawings and the description below. Note that the relative dimensions of the following figures may not be drawn to scale unless specifically indicated as being scaled drawings.

Wafer uniformity is an important factor in the processing of high quality semiconductor wafers. In certain implementations of semiconductor processing, a liquid precursor may need to be evaporated or vaporized before being deposited on a semiconductor wafer. Complete evaporation of the precursor may have a large effect on the processing uniformity of processed semiconductor wafers. The present inventors have determined that many commercial off-the-shelf vaporizers exhibit less than complete vaporization of the precursor.

It is to be understood that, as used herein, the term "semiconductor wafer" may refer both to wafers that are made of a semiconductor material, e.g., silicon, and wafers that are made of materials that are not generally identified as semiconductors, e.g., epoxy, but that typically have semiconductor materials deposited on them during a semiconductor processing. The apparatuses and methods described in this disclosure may be used in the processing of semiconductor wafers of multiple sizes, including 200 mm, 300 mm, and 450 mm diameter semiconductor wafers.

The vaporizer described herein can be used to process a semiconductor substrate such as a wafer during chemical vapor deposition of material on the substrate. Such vaporizers may include an atomizer nozzle to spray liquid precursor into a fine mist of droplets that are then partially or wholly evaporated by being entrained in a heated gas. The vaporizer described herein is a turbulent vaporizer which may be used with any precursor suitable for use in semiconductor processing, as well as liquids that are not necessarily related to semiconductor manufacturing. The turbulent flow vaporizer uses a single spiral flow channel, which can be machined into stacked plates or as a length of tubing cast into a block coupled with constant turbulent flow of carrier gas and an ultrasonically atomized precursor. The turbulent flow vaporizer can be customized to have a variable length and to increase residence time inside of the vaporizer. The single flow path cross sectional area of the turbulent flow vaporizer can be varied to ensure that the precursor and carrier gas flow rate is always in the turbulent regime. An example would be: smaller cross sectional flow area for lower precursor flow rates, while maintaining turbulent flow. In the turbulent flow vaporizer, ultrasonically atomized precursor and carrier gas enter the vaporizer in a turbulent state so that a much higher heat transfer rate to the fluid mixture occurs, while moving the mixture through the vaporizer as quickly as possible. Thus, it is possible to achieve very fast and stable vapor production using the turbulent flow vaporizer in about 2 seconds for full stable vapor flow at the highest liquid flow rates. In contrast, conventional vaporizers require 5 seconds or more to produce full stable vapor flow at any flow rate. The turbulent flow vaporizer includes multiple heated zones to ensure fast control over the vaporization process and to minimize target temperature overshoot.

Conventional vaporizers typically function by first atomizing the liquid to be vaporized into a mist of fine droplets that are then heated in a gaseous environment, e.g., entrained in a heated carrier gas. The theory of operation of such conventional vaporizers is that the atomization partitions the liquid into a multitude of smaller portions with a greater surface-area-to-volume ratio than existed in the precursor prior to atomization and that such an increased surface-area-to-volume ratio results in relatively rapid evaporation of the remaining liquid-phase precursor in the heated carrier gas.

Due to the manner in which such conventional vaporizers work, the carrier gas must flow through the vaporizer at relatively high speeds, e.g., 300 m/s. Since the degree of evaporation is based on residence time of the atomized precursor/carrier gas in the heated environment of the vaporizer, the flow path length of the precursor/carrier gas is generally viewed to be determinative of the degree of vaporization experienced and volatilization of liquid precursor can take 5 seconds or more. This presents an issue since the atomized precursor/carrier gas mixture flows at a high rate of speed and thus travels through the vaporizers quickly—while residence time can be increased by extending the flow path length, vaporizer manufacturers are typically constrained by the packaging envelopes of semiconductor manufacturing tools, i.e., such manufacturers typically try to minimize size of the vaporizer so as to have more room for other equipment. Most conventional vaporizers are designed such that their flow path lengths, and thus atomized precursor residence times, are sufficiently long enough to theoretically vaporize all of the atomized droplets (without being too long); due to the packaging constraints discussed above, these flow paths are usually not made any longer.

However, such designs typically rely on an average droplet size when such flow path lengths are determined. Since some droplets will be bigger and some smaller in actual practice, the smaller-size droplets will still completely evaporate, but the larger-sized droplets will frequently exit such vaporizers before completely evaporating. Having droplets exit the vaporizer before complete vaporization may lead to wafers experiencing unacceptable amounts of defects due to such incomplete precursor vaporization on the part of a conventional vaporizer. As semiconductor fabrication techniques continue to advance, there is less tolerance for the number of defects left by leftover, unevaporated droplets.

It is to be understood that, as used herein, the term "process fluid" may refer to a liquid, a gas, or any combination of liquid or gaseous fluids appropriate for substrate processing, including precursors and carrier gas. This disclosure may additionally identify components based on the process fluid that the component is designed to flow. Hence, a first process fluid cap plate may be designed to flow a first process fluid.

Figure 3:
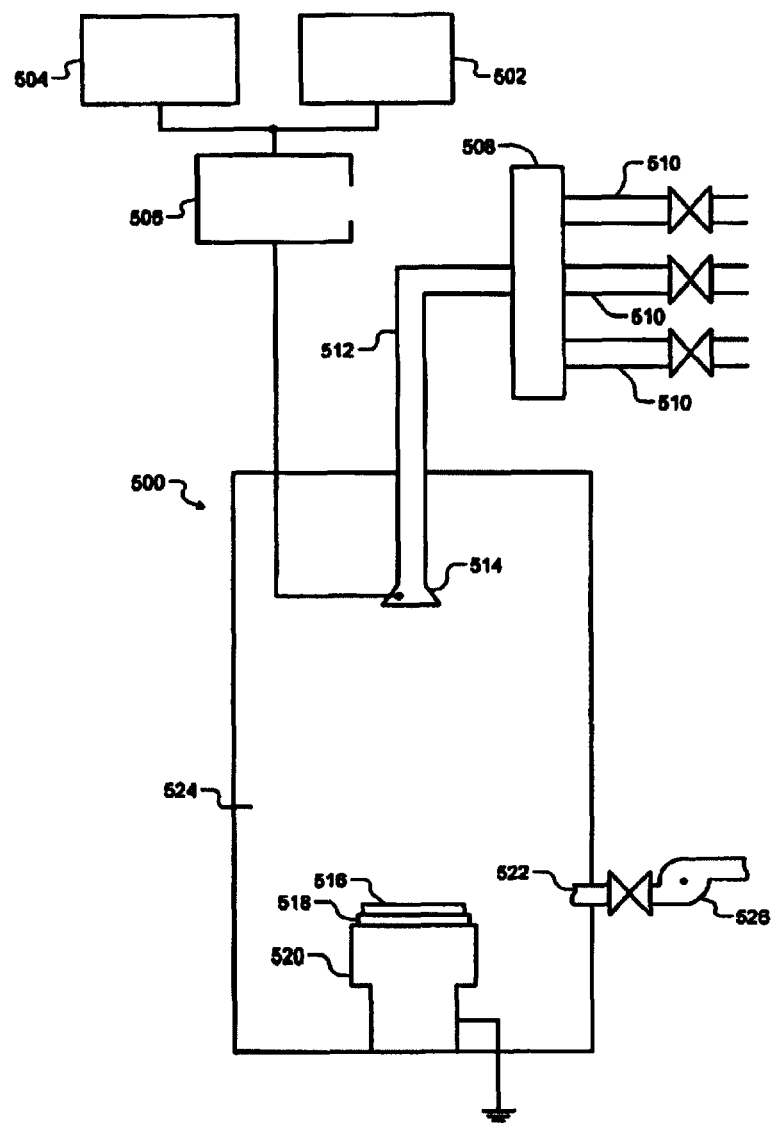
FIG. 3 shows a chemical vapor deposition apparatus which includes a chamber in which a semiconductor wafer is processed using the vaporizer shown in FIG. 1.

Referring now to FIG. 1, a precursor vapor generation and delivery system 100 is shown. The system 100 includes a heat exchanger 102, a vaporizer 104, two or more parallel vapor precursor delivery paths 106 (i.e. at least one redundant path) and a chamber 108 (as shown in FIG. 3). Each of the vapor precursor delivery paths 106 includes a filter 110. The filter 110 may include a heating jacket for temperature control. Zero, one or more of the vapor precursor delivery paths 106 can be selected by a control module (described below in FIG. 3) using gate valves 112. A diverter (not shown in FIG. 1) allows the vapor precursor to be diverted or supplied to the chamber 108. Other valves (e.g. purge valves 116 and/or vacuum valves 118) are used during a purge operation of the filters 110. For example only, the purge operation may be used when changing from one type of precursor to another.

Pressure manometers 120 are used to monitor pressures in the vapor precursor delivery paths 106. The control module (as shown in FIG. 3) monitors outputs of the pressure manometers 120 and generates a pressure differential. A filter clean/dirty status may be determined based on the pressure differential and one or more predetermined thresholds. As a result, the control module may be used to determine when the filter 110 in a particular path 106 needs to be changed. The control module may also use two or more different pressure differential thresholds depending upon the type of precursor that is being supplied.

By providing multiple paths, the flow of vapor precursor can be changed from one or more paths to one or more other paths very quickly if needed instead of shutting down the system 100 to change the filter. As a result, the precursor vapor generation and delivery system 100 may provide improved uptime. This is due in part to the ability of the precursor vapor generation and delivery system 100 to switch the vapor precursor delivery path from a path with a clogged filter to a path with a clean filter and subsequently continue operation. In addition, the paths from the vaporizer through the heat exchanger/filter to the chamber are heated by filter, conduit and/or valve heating units. More uniform heating reduces the incidence of particles in the system 100.

Figure 2:
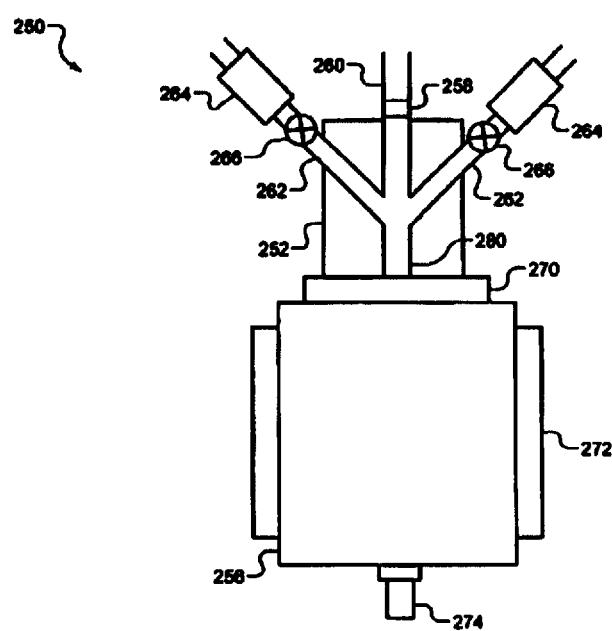
FIG. 2 shows aspects of the vaporizer shown in FIG. 1.

Referring now to FIG. 2, an exemplary vaporizer 250 according to the present disclosure is shown. The vaporizer 250 includes an atomizer 252 and a heat exchanger/filter 256. For example only, the heat exchanger/filter 256 may be implemented by a Turbo Vaporizer as manufactured by MSP Corporation, though other suitable heat exchanger/filters may be used. A restrictor orifice 258 may be arranged at an inlet 260 of the atomizer 252. A carrier gas flows through the restrictor orifice 258 and exits at a high linear velocity. For example only, the carrier gas may have a linear velocity that is greater than 300 meters/second, although other velocities may be used. One or more liquid precursor inlets 262 of the atomizer 252 receive liquid precursor via liquid flow controllers (LFCs) 264 and valves 266.

The drag of the high velocity gas on the liquid precursor provides a mechanism for atomization. The high velocity carrier gas transfers momentum to the liquid precursor, which causes a shearing effect. The shearing effect breaks the surface tension of liquid precursor and creates droplets. For example only, the droplets may have a diameter of 1-5 microns, although other larger or smaller droplet sizes may be used.

A thermal break or insulator 270 may be provided between the atomizer 252 and the heat exchanger/filter 256. The thermal break 270 decouples thermal characteristics of the heat exchanger/filter 256 and the atomizer 252. The heat exchanger/filter 256 heats the droplets so that the droplets vaporize. The heat exchanger/filter 256 includes, for example only, a band heater 272. The filter (not shown) of the heat exchanger/filter 256 may be arranged to receive and filter the output of the heat exchanger/filter 256. The filter has one or more membranes through which the vapor precursor passes. The output of the filter may form a nozzle 274. An additional heater (not shown) may be provided to heat the vaporized precursor at the outlet of the filter.

The heat exchanger/filter 256 may include a plurality of channels that heat and recirculate the droplets to form vapor precursor. Some of the channels may recirculate back near an inlet 280 of the heat exchanger/filter 256. Other channels may be directed towards the filter. The fine droplets are converted into vapor before reaching the filter.

Referring now to FIG. 3, an exemplary CVD system is shown. The deposition of film is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

During wafer processing, each wafer is held in place by a pedestal, wafer chuck and/or other wafer holding apparatus. For certain operations, the apparatus may include a heater such as a heating plate to heat the wafer.

For example, a reactor 500 in FIG. 3 includes a process chamber 524, which encloses other components of the reactor and contains the plasma. The plasma may be generated by a capacitor type system including a showerhead 514 working in conjunction with a grounded heater block 520. A high-frequency RF generator 502, connected to a matching network 506, and a low-frequency RF generator 504 are connected to the showerhead 514. The power and frequency supplied by matching network 506 is sufficient to generate plasma from the process gas.

Within the reactor, a wafer pedestal 518 supports a substrate 516. The pedestal 518 typically includes a chuck, a fork, or lift pins to hold and transfer the substrate during and between the deposition and/or plasma treatment reactions. The chuck may be an electrostatic chuck, a mechanical chuck or various other types of chuck.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process.

Process gases exit chamber 524 via an outlet 522. A vacuum pump 526 (e.g., a one or two stage mechanical dry pump and/or a turbomolecular pump) draws process gases out and maintains a suitably low pressure within the reactor by a close loop controlled flow restriction device, such as a throttle valve or a pendulum valve.

It is possible to index the wafers after every deposition and/or post-deposition plasma anneal treatment until all the required depositions and treatments are completed, or multiple depositions and treatments can be conducted at a single station before indexing the wafer.

A control module for controlling the systems of FIGS. 1-3 may include a processor, memory and one or more interfaces. The control module may be employed to control devices in the system based in part on sensed values. For example only, the control module may control one or more of valves, filter heaters, pumps, and other devices based on the sensed values and other control parameters. The control module can receive the sensed values from, for example only, pressure manometers, flow meters, temperature sensors, and/or other sensors. The control module may also be employed to control process conditions during precursor delivery and deposition of the film. The control module will typically include one or more memory devices and one or more processors.

The control module may control activities of the precursor delivery system and deposition apparatus. The control module can execute computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module may also monitor the pressure differential and automatically switch vapor precursor delivery from one or more paths to one or more other paths. Other computer programs stored on memory devices associated with the control module may be employed in some embodiments.

Typically there will be a user interface associated with the control module. The user interface may include a display (e.g. a display screen and/or graphical software displays of the apparatus and/or process conditions), and user input devices such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers, and thermocouples located in delivery system, the pedestal or chuck (e.g. the temperature sensors). Appropriately programmed feedback and control algorithms may be used with data from these sensors to maintain desired process conditions. The foregoing describes implementation of embodiments of the invention in a single or multi-chamber semiconductor processing tool.

Figure 4:
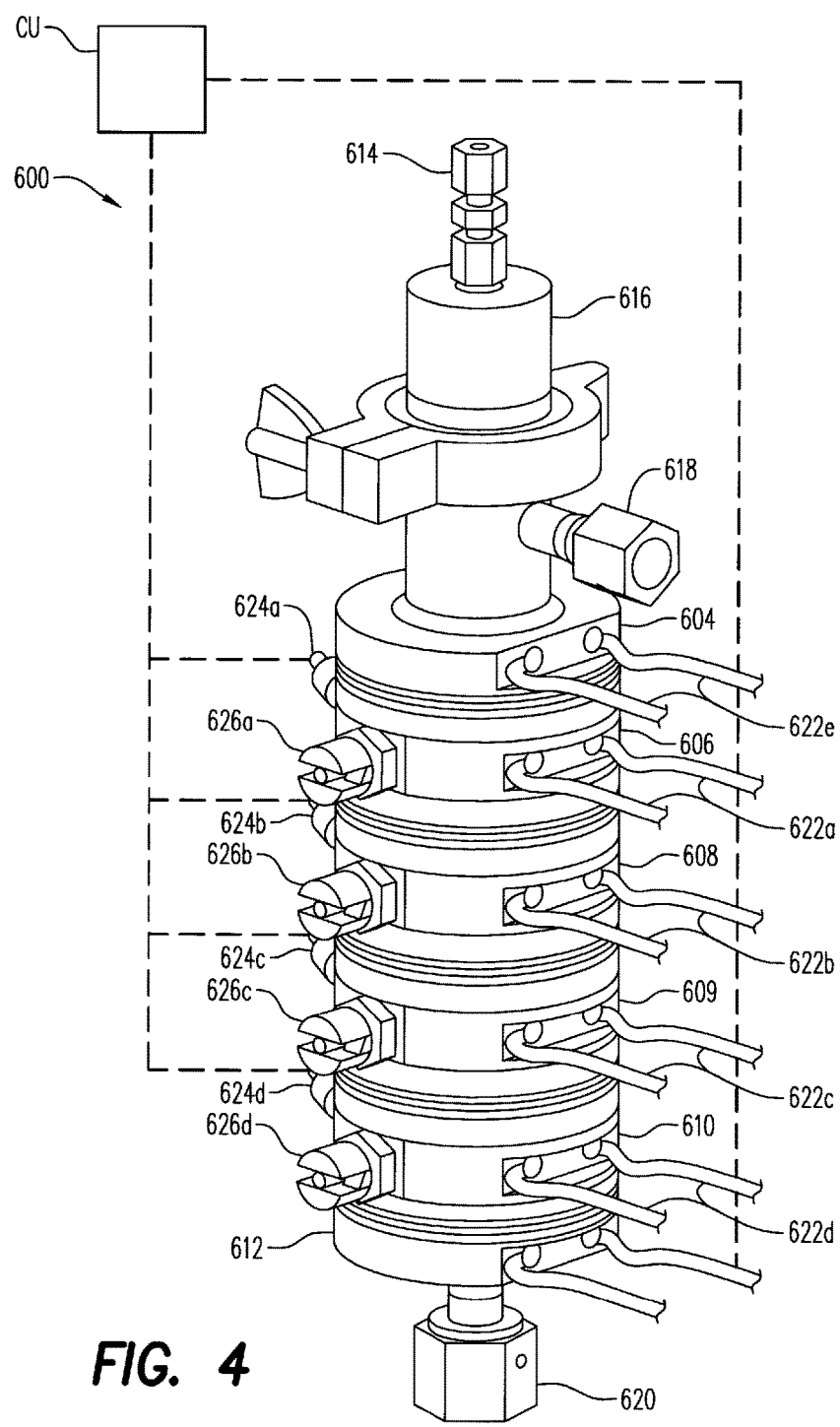
FIG. 4 shows an example of a vaporizer having a stacked plate arrangement.

FIG. 4 shows an example of a vaporizer 600 which comprises a stacked plate arrangement 602 including a top plate 604, a first plate 606, a second plate 608, a third plate 610, and a bottom plate 612. A liquid precursor enters a precursor inlet 614 and is atomized by ultrasonic nozzle 616. Carrier gas such as nitrogen or helium enters gas inlet 618 and travels through a single spiral flow path 632 extending through the stacked plate arrangement and exits via vapor outlet 620. Each of the plates 606, 608, 610, 612 can include a heater 622 a-d such as a pair of heating elements located in each of the plates. For example, first plate 606 can include a pair of cartridge heaters 622a located in parallel and spaced apart bores 606b extending into an outer periphery of the plate 606. Similarly, second plate 608 can include a pair of heating elements 622b in bores 608b extending into an outer periphery of plate 608, third plate 610 can include a pair of heating elements 622c in bores 610b extending into an outer periphery of plate 610, and bottom plate 612 can include a pair of heating elements 622d in bores 612b extending into an outer periphery of plate 612. Likewise, top plate 604 can include a pair of heating elements 622e in bores 604b extending into an outer periphery of plate 604.

To monitor temperatures of each of the plates 604, 606, 608, 610, 612 temperature sensors can be mounted on the plates. For example, first plate 606 can include a temperature sensor 624a in a bore extending into an outer periphery of the plate 606. Similarly, second plate 608 can include a temperature sensor 624b in a bore extending into an outer periphery of plate 608, third plate 610 can include a temperature sensor 624c in a bore extending into an outer periphery of plate 610, and bottom plate 612 can include a temperature sensor 624d in a bore extending into an outer periphery of bottom plate 612. Similarly, top plate 604 can include a temperature sensor in a bore extending into an outer periphery of plate 604.

Over temperature switches 626 a-d can also be incorporated into the stacked plate arrangement to control heating of the plates. In the stacked plate arrangement, a control unit CU can monitor the temperature sensors 624 a-d and individually adjust the temperature in each heating zone.

Figure 5:
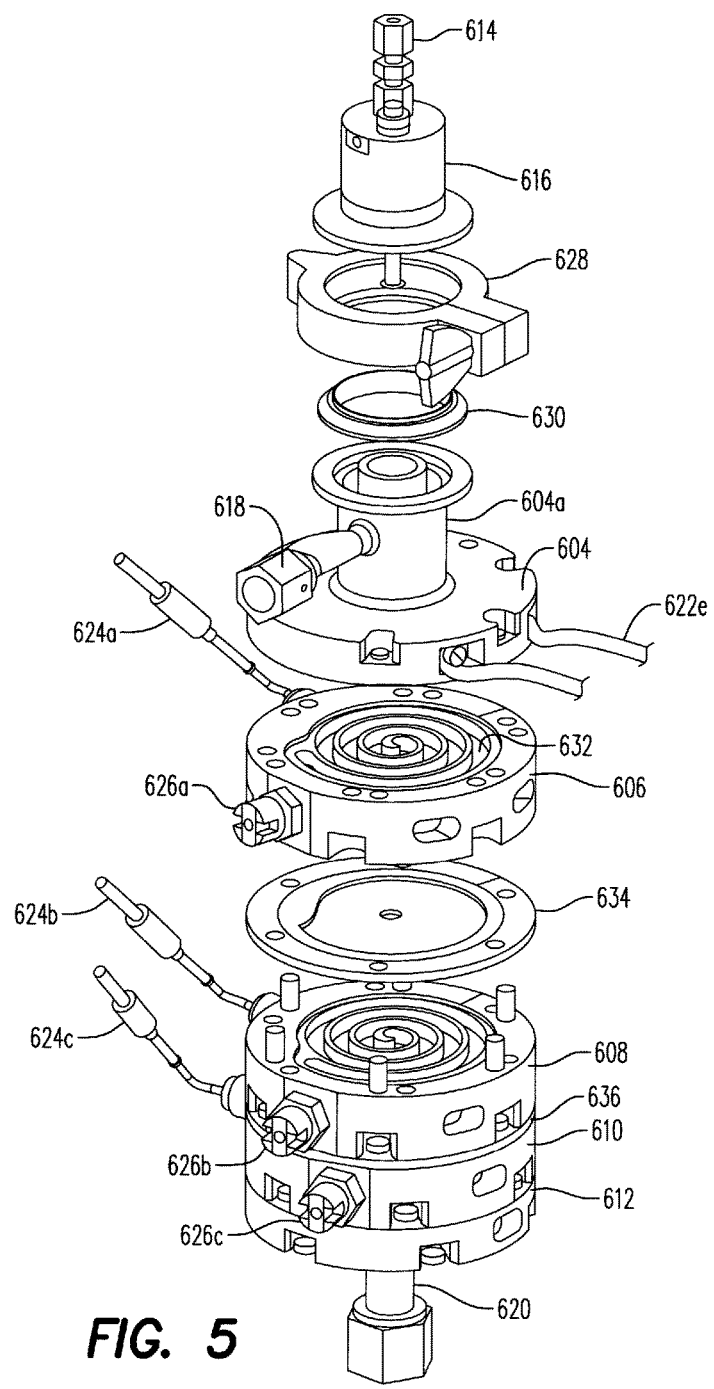
FIG. 5 shows an exploded view of the vaporizer shown in FIG. 4.

FIG. 5 shows an exploded view of the vaporizer 600 shown in FIG. 4. As shown, the ultrasonic nozzle 616 can be mounted to an upper extension 604a of the top plate 604 by means of a clamp 628 with an O-ring seal 630 therebetween. The first plate 606 can have an upper spiral channel 632a machined into an upper surface of the plate 606 and a lower spiral channel (not shown) machined into a lower surface of the plate 606, the spiral channels connected by a through passage (not shown) to form a flow path through the plate 606. The first plate 606 can be separated from the second plate 608 by a divider plate 634 having a passage 634a therein to connect the flow path in first plate 606 to the flow path in second plate 608. The second plate 608 can be separated from the third plate 610 by another divider plate 636 which has a passage 636a connecting the flow path in second plate 608 to the flow path in third plate 610. With the stacked plate arrangement, carrier gas entering inlet 618 is mixed with atomized precursor liquid provided by ultrasonic nozzle 616 and the mixture flows through the flow path 632 formed by the spiral channels and connecting passages such that the mixture is heated and forms a vapor which exits through vapor exit 620. For example, the flow path 632 includes a first spiral path 632a extending in a first plane from a central portion of the vaporizer to an outer portion of the vaporizer, a second spiral path 632b extending in a second plane from the outer portion of the vaporizer to the central portion of the vaporizer, a third spiral path 632d extending in a third plane from the central portion of the vaporizer to the outer portion of the vaporizer, and a fourth spiral path 632e extending in a fourth plane from the outer portion of the vaporizer to the central portion of the vaporizer. The mixture can be heated in independently controlled heated zones while flowing through the vaporizer. For example, the mixture can be heated to a first temperature in a first thermal zone comprising the first and second spiral flow paths and heated to a second temperature in a second thermal zone comprising the third and fourth spiral flow paths. The first and second temperatures can be the same or different temperatures and the temperatures in the thermal zones can be individually controlled.

Figure 6:
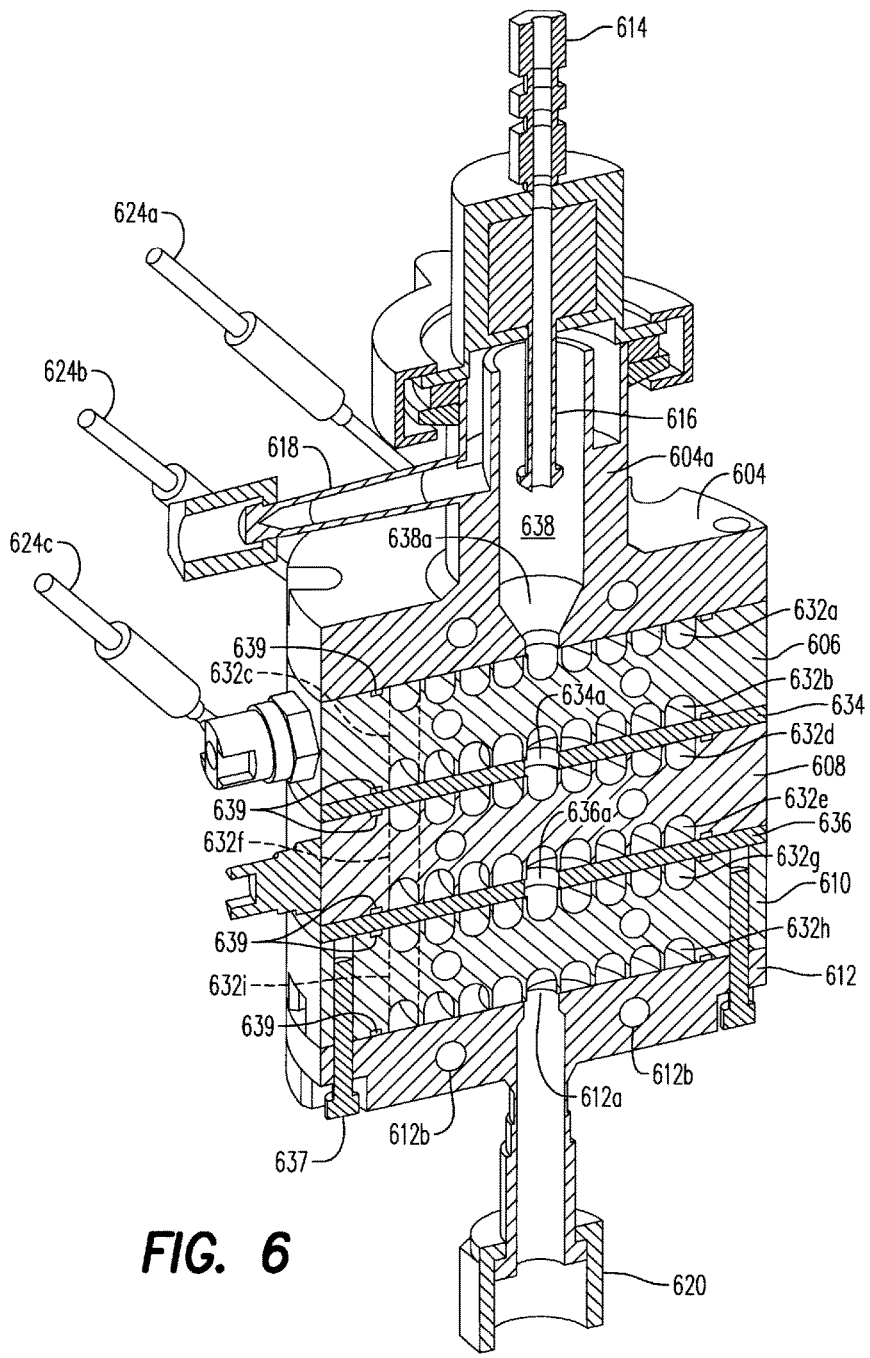
FIG. 6 shows a cut-away view of the vaporizer shown in FIG. 4.

FIG. 6 shows a cut-away view of the vaporizer 600 shown in FIG. 4. As shown, the atomized liquid precursor supplied by ultrasonic nozzle 616 enters mixing chamber 638 where it is mixed with carrier gas supplied by inlet 618, the mixture enters a conical portion 638a of the mixing chamber 638 and enters a flow path 632 in the stacked plate arrangement.

The flow path 632 includes the upper spiral channel 632a machined into an upper surface of first plate 606, a lower spiral channel 632b machined into a lower surface of the first plate 606, and a connecting passage 632c extending vertically in the first plate 606 between an outer end of the upper spiral channel 632a and an outer end of the lower spiral channel 632b. The inner end of the lower spiral channel 632b is connected to a central passage 634a in divider plate 634.

The flow path 632 includes an upper spiral channel 632d machined into an upper surface of second plate 608, a lower spiral channel 632e machined into a lower surface of the second plate 608, and a connecting passage 632f extending vertically in the second plate 608 between an outer end of the upper spiral channel 632d and an outer end of the lower spiral channel 632e. The inner end of the lower spiral channel 632e is connected to a central passage 636a in divider plate 636.

The flow path 632 includes the upper spiral channel 632g machined into an upper surface of third plate 610, a lower spiral channel 632h machined into a lower surface of the third plate 610, and a connecting passage 632i extending vertically in the third plate 610 between an outer end of the upper spiral channel 632g and an outer end of the lower spiral channel 632h. The inner end of the lower spiral channel 632h is connected to a central passage 612a in bottom plate 612.

The plates 604, 606, 608, 610, 612 can be held together in any suitable manner. For example, the plates can be clamped together using suitable fasteners such as bolts 637 with O-rings 639 in opposed grooves near outer peripheries of adjacent plates to seal the plates together. Alternatively, the outer peripheries of the plates can be edge welded to seal the plates together. It is not necessary to add seals in the center of the plates for the center openings which simplifies manufacture of the stacked plate arrangement.

Figure 7:
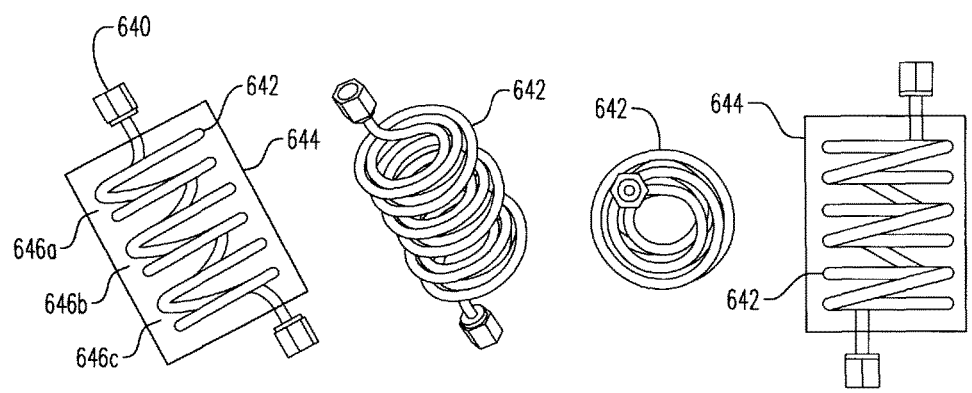
FIG. 7 shows examples of helical flow paths which can be used in vaporizers having a tubular flow path embedded in a metal body.

FIG. 7 shows details of a flow path 640 formed by a helical tube 642 which can be embedded in a body such as a metal body 644 having heater zones located along the length of the flow path 640. Like the embodiment of the stacked plate arrangement, the flow path is a single flow path in which different sections of the flow path can be heated by heaters which are individually controlled to provide a desired temperature in each zone of the flow path. As an example, the flow path can be provided by a stainless steel tube cast in an aluminum block. Such an arrangement involves fewer seals and fewer machined parts than the stacked plate arrangement. The tube diameter and length can be selected to achieve turbulent flow for a desired flow of vapor taking into account the particular atomized liquid precursor and carrier gas to be used for generating the vapor delivered to the chemical vapor deposition chamber. The spiral tubing can be shaped to provide multiple heating zones such as by arranging one or more loops of the spiral tubing closer together. As shown in FIG. 7, the loops can be arranged to provide three heating zones 646 *a-c* wherein each heating zone has two loops of the spiral tubing 642. After casting the spiral tubing 642 in a block of aluminum 644, a pair of cartridge heaters (not shown) can be placed in bores located at each heating zone 646 *a-c*. As in the stacked plate arrangement, each heating zone can include a temperature sensor and a control unit can monitor the temperature sensors and individually adjust the temperature in each heating zone.

In certain implementations, the material of the vaporizer may have high thermal conductivity, such as a thermal conductivity above 100 W/(m*K). Examples of suitable first materials include silicon carbide such as chemical-vapor deposition (CVD) silicon carbide, aluminum, copper, molybdenum, nickel, platinum, tungsten. In other implementations, the stacked plate arrangement may be made from one material with a coating of a second material lining the flow path. In the implementations above, the material on the outside of the vaporizer may be chemically non-reactive with any process fluid used in the vaporizer. The plates of the stacked plate arrangement may be attached together by any suitable manner such as clamps, screws, or other attachment mechanisms. In an example, the stacked plates can be made of stainless steel or aluminum plates which are welded or bolted together. During operation of the vaporizer, the heating zones can heat the flow path to a suitable temperature range such as about 150° C. to about 200° C.

The turbulent flow vaporizer described above can provide stable vapor flow more quickly than conventional vaporizers. In addition, the multiple zones of temperature control can provide better control of the vapor temperature and avoid over temperature issues. A further advantage is that the turbulent flow vaporizer does not require a vapor filter for the vapor exiting the vaporizer. In contrast, it is common for PECVD apparatuses to include a filter downstream of the vaporizer to ensure no droplets are delivered to the process chamber.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. A vaporizer useful for supplying vapor to a chemical vapor deposition apparatus in which a semiconductor substrate is processed, the vaporizer comprising: a first inlet configured to receive an atomized precursor, a second inlet configured to receive carrier gas, a single spiral flow path in fluid communication with the first and second inlets and configured to effect turbulent flow of an atomized precursor and carrier gas stream supplied to the first and second inlets, a plurality of heating elements including a first heater element configured to heat a first zone of the flow path and a second heater element configured to heat a second zone of the flow path, and an outlet in fluid communication with the flow path and configured to deliver vapor produced from the atomized precursor.

2. The vaporizer of claim 1, wherein the flow path extends through a stacked plate arrangement, the stacked plate arrangement including a top plate having the first and second inlets therein, a first plate having the first heater element therein, a second plate having the second heater element therein, a first divider plate between the first and second plates and a bottom plate having the outlet therein.

3. The vaporizer of claim 2, wherein a first portion of the flow path extending through the first plate includes a first upper spiral channel in an upper surface thereof, a first lower spiral channel in a lower surface thereof, and a first connecting passage providing fluid communication between the first upper spiral channel and the first lower spiral channel, the first plate attached to the top plate such that the first portion of the flow path is in fluid communication with the first and second inlets.

4. The vaporizer of claim 3, wherein a second portion of the flow path extending through the second plate includes a second upper spiral channel in an upper surface thereof, a second lower spiral channel in a lower surface thereof, and a second connecting passage providing fluid communication between the second upper spiral channel and the second lower spiral channel, the first divider plate including a first passage therein connecting the first portion of the flow path in the first plate to the second portion of the flow path in the second plate.

5. The vaporizer of claim 4, further comprising a third plate having a third heater element therein and a second divider plate between the second and third plates, a third portion of the flow path in the third plate includes a third upper spiral channel in an upper surface thereof and a third lower spiral channel in a lower surface thereof, and a third connecting passage providing fluid communication between the third upper spiral channel and the third lower spiral channel, the second divider plate including a second passage therein connecting the second portion of the flow path in the second plate to the third portion of the flow path in the third plate.

6. The vaporizer of claim 5, wherein O-ring seals are located between adjacent plates of the stacked plate arrangement, the first passage in the first divider plate is located in a center of the first divider plate and the second passage in the second divider plate is located in a center of the second divider plate.

7. The vaporizer of claim 2, wherein the first heating element comprises a first pair of resistance heaters located in horizontal bores extending into an outer periphery of the first plate, the second heating element comprises a second pair of resistance heaters located in horizontal bores extending into an outer periphery of the second plate, the first and second plates including temperature sensors configured to monitor temperatures of the first and second plates and provide feedback to a control unit configured to individually adjust temperatures of the first and second portions of the flow path.

8. The vaporizer of claim 5, the first heating element comprises a first pair of resistance heaters located in horizontal bores extending into an outer periphery of the first plate, the second heating element comprises a second pair of resistance heaters located in horizontal bores extending into an outer periphery of the second plate, the third heating element comprises a third pair of resistance heaters located in horizontal bores extending into an outer periphery of the third plate, the first, second and third plates including temperature sensors configured to monitor temperatures of the first, second and third plates and provide feedback to a control unit configured to individually adjust temperatures of the first, second and third portions of the flow path.

9. The vaporizer of claim 1, wherein the flow path passes through a spiral tube embedded in a metal block, the metal block including a heating element configured to heat a first portion of the flow path and a second heating element configured to heat a second portion of the flow path, the metal block including temperature sensors configured to monitor temperatures of the first and second portions of the flow path and provide feedback to a control unit configured to individually adjust temperatures of the first and second portions of the flow path.

10. The vaporizer of claim 1, wherein the flow path has a constant cross sectional flow area along the entire length thereof.

11. The vaporizer of claim 2, wherein the first and second upper spiral channels are machined into the upper surfaces of the first and second plates, the first and second lower spiral channels are machined into the lower surfaces of the first and second plates, the first connecting passage extends between outermost portions of the first upper spiral channel and the first lower spiral channel, and the second connecting passage extends between outermost portions of the second upper spiral channel and the second lower spiral channel.

12. The vaporizer of claim 1, further comprising an ultrasonic nozzle in fluid communication with the first inlet.

13. A chemical vapor deposition apparatus including a chamber in which a semiconductor substrate can be processed and the vaporizer of claim 12, the vaporizer configured to supply vaporized precursor into the chamber to deposit a layer of material on a semiconductor substrate supported therein.

14. The chemical vapor deposition apparatus of claim 13, further comprising a control unit and temperature sensors configured to monitor temperatures of first and second portions of the flow path and provide feedback to the control unit configured to individually adjust temperatures of the first and second portions of the flow path.

15. The chemical vapor deposition apparatus of claim 14, wherein the atomized precursor can be converted into vapor in the flow path and supplied to the chamber within 2 seconds.

16. A method of supplying vapor produced by the vaporizer of claim 1 to a chamber of a chemical vapor deposition apparatus, the method comprising supplying atomized liquid precursor to the first inlet, supplying carrier gas to the second inlet, flowing the atomized liquid precursor and carrier gas in the flow path while heating a first portion of the flow path to a first temperature and heating a second portion of the flow path to a second temperature, and flowing vapor from the outlet to an interior of the chamber.

17. The method of claim 16, wherein the atomized liquid precursor and carrier gas is converted to a vapor in the flow path and supplied to the chamber within two seconds after traveling along the flow path, the flow path including a first spiral path extending in a first plane from a central portion of the vaporizer to an outer portion of the vaporizer, a second spiral path extending in a second plane from the outer portion of the vaporizer to the central portion of the vaporizer, a third spiral path extending in a third plane from the central portion of the vaporizer to the outer portion of the vaporizer, and a fourth spiral path extending in a fourth plane from the outer portion of the vaporizer to the central portion of the vaporizer.

18. The method of claim 17, further comprising monitoring temperatures of the first and second portions of the flow path with temperature sensors, supplying data to a control unit representative of the monitored temperatures, and individually controlling temperatures of the first and second portions of the flow path based on the monitored temperatures.

19. The method of claim 16, wherein the flow path has a constant cross sectional flow area along the entire length thereof and the atomized liquid precursor and carrier gas undergo turbulent flow in the flow path.

20. The method of claim 16, further comprising supporting a semiconductor substrate in the chamber, energizing the vapor into a plasma state, and depositing a layer of material on the semiconductor substrate.

* * * * *